(12) United States Patent
Ravi et al.

(10) Patent No.: US 6,885,873 B2
(45) Date of Patent: Apr. 26, 2005

(54) ADAPTIVELY EXTENDING TUNABLE RANGE OF FREQUENCY IN A CLOSED LOOP

(75) Inventors: Ashoke Ravi, Hillsboro, OR (US); Krishnamurthy Soumyanath, Portland, OR (US); Gaurab Banerjee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 10/324,686

(22) Filed: Dec. 19, 2002

(65) Prior Publication Data
US 2004/0119547 A1 Jun. 24, 2004

(51) Int. Cl.[7] ................................................. H04B 7/00
(52) U.S. Cl. ........................................ 455/517; 331/17
(58) Field of Search ............................ 331/182, 17, 25, 331/36 C; 455/517, 524

(56) References Cited

U.S. PATENT DOCUMENTS

| | | | | |
|---|---|---|---|---|
| 5,548,814 A | * | 8/1996 | Lorang et al. | 370/310 |
| 5,739,730 A | * | 4/1998 | Rotzoll | 331/177 V |
| 6,091,304 A | * | 7/2000 | Harrer | 331/10 |
| 6,134,425 A | | 10/2000 | Willwerth | 455/130 |
| 6,163,276 A | * | 12/2000 | Irving et al. | 340/870.4 |
| 2003/0025566 A1 | * | 2/2003 | Rogers | 331/109 |

* cited by examiner

Primary Examiner—Robert Pascal
Assistant Examiner—Joseph Chang
(74) Attorney, Agent, or Firm—Trop, Pruner & Hu, P.C.

(57) ABSTRACT

A semiconductor device or a circuit includes a controllable oscillator and circuitry that senses a voltage which may control the controllable oscillator and digitally controls a gain compensation, adaptively compensating for a drop in a gain against overall loop gain within a closed loop. In one embodiment, a single supply source may be used to power the closed loop while a variable gain stage that is digitally controllable may adjust the gain in a feed-forward manner based on the drop.

4 Claims, 9 Drawing Sheets

ADAPTIVELY EXTENDING TUNABLE RANGE OF FREQUENCY IN A CLOSED LOOP

BACKGROUND

This invention relates generally to tuning of frequencies, and particularly to adaptively extending a tunable range of frequency of a closed loop within a semiconductor device or a circuit.

To optimally operate a semiconductor device or a circuit, tuning of frequencies may be desired in a variety of situations. Extending a tunable range of frequency up to a full range of an oscillator is typically required in a closed loop system, such as a phase-locked loop or frequency synthesizer, as few examples. Although any one of different types of oscillators may be used in such a closed loop system, certain circumstances may limit the use to one type of an oscillator. For instance, stringent phase-noise specifications in most wireless standards dictate use of a LC oscillator, a resonant circuit containing inductors and capacitors. But LC oscillators can typically be tuned only over a relatively narrow range of frequencies, failing to cover the entire spectrum used by a particular wireless standard. When a tunable range is restricted only to the linear region of the frequency relative to the oscillator control voltage curve, the entire usable spectrum of a wireless standard may not be completely used. Wireless standards may mandate that semiconductor devices or circuits with a closed loop stay usable across multiple frequency bands.

For semiconductor devices or circuits fabricated using digital manufacturing processes, providing high-performance, low cost and power radio frequency (RF) transceivers pose additional challenges, especially in a single supply operation. Maintaining a settling time and phase noise performance at an adequate level may become difficult, in one case, since the transfer characteristic of such a device or a circuit becomes extremely non-linear at extreme ends. Even worse, power dissipation may increase at all frequencies because without incurring some penalty in power dissipation, an analog variable gain control may not allow a linear compensation of tuning characteristics of any general oscillator circuit.

Thus, there is a continuing need for better ways to controllably extend a tunable range of frequency in a closed loop, especially within a semiconductor device or a circuit.

DETAILED DESCRIPTION

Figure 1A:
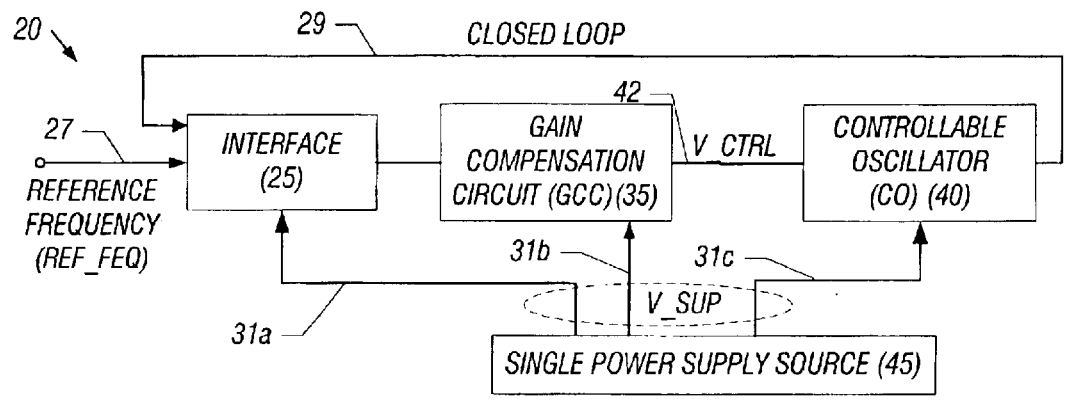
FIG. 1A is a schematic depiction of a closed loop system which is adaptable to provide an extended tunable range of frequency consistent with one embodiment of the present invention.

A closed loop system 20, as shown in FIG. 1A, includes an interface 25 to receive a reference frequency (REF_FEQ) signal on an input line 27 and feedback on a closed loop path 29 while operatively coupled to a gain compensation circuit (GCC) 35, according to one embodiment of the present invention. In addition, a supply voltage (V_SUP) on supply lines 31a–31c may power the closed loop system 20. Examples of the closed loop system 20 include a phase-locked loop (PLL) and a frequency synthesizer. The gain compensation circuit 35 may operatively couple the interface 25 to a controllable oscillator (CO) stage 40 to adaptively compensate for a drop in a gain in some embodiments of the present invention. The gain may refer to a slope of a frequency vs. voltage (f-V) curve for the closed loop system 20, for example, df/dV (Hz/V), in accordance with one embodiment of the present invention. According to one operation consistent with an embodiment, the gain compensation circuit 35 may provide a control voltage (V_CTRL) on a control signal line 42, controlling the gain of the controllable oscillator stage 40. Within the closed loop of the closed loop system 20, the gain compensation circuit 35 may digitally provide an adaptive gain compensation for a drop in a gain against an overall loop gain.

Instead of using multiple power supplies, according to many embodiments of the present invention, a single power supply source 45 may power each of the interface 25, the controllable oscillator stage 40, and the gain compensation circuit 35, supplying the supply voltage V_SUP on the respective supply lines 31a through 31c. Use of the control voltage V_CTRL within the supply voltage (V_SUP) range from Vss to Vcc may enable operation over a wider range of frequencies in one embodiment in certain examples of an embodiment. In this manner, the tunable range of frequencies may be extended from an uncompensated range of frequencies of the f-V curve to another compensated range of frequencies.

In one embodiment, the interface 25 may receive the reference frequency REF_FEQ signal and the supply voltage V_SUP from a source external (e.g., the single power supply source 45) to the closed loop system 20. In other embodiments of the present invention, a semiconductor device or a circuit incorporating the closed loop system 20 may be fabricated using a single supply, low-voltage complementary metal oxide semiconductor (CMOS) process.

Using the gain compensation circuit 35, a variety of semiconductor devices or circuits including embedded devices, such as the one having a flash memory disposed within a wireless device, may enable a completely feed-forward digitally controlled extension of the tunable range of frequencies for the closed loop system 20. The gain compensation circuit 35 may extend the tunable frequencies in a PLL or a frequency synthesizer to substantially commensurate with a full range of the controllable oscillator stage 40 while still maintaining design specifications, such as a settling time and a phase noise performance, in one embodiment. While the tuning range of frequency is being extended via the gain compensation circuit 35, stringent phase-noise design specifications may have to be substantially met in the closed loop system 20 since some of wireless standards dictate the use of a specific oscillator, such as an LC oscillator (a resonant circuit that contains inductors and capacitors).

Figure 1B:
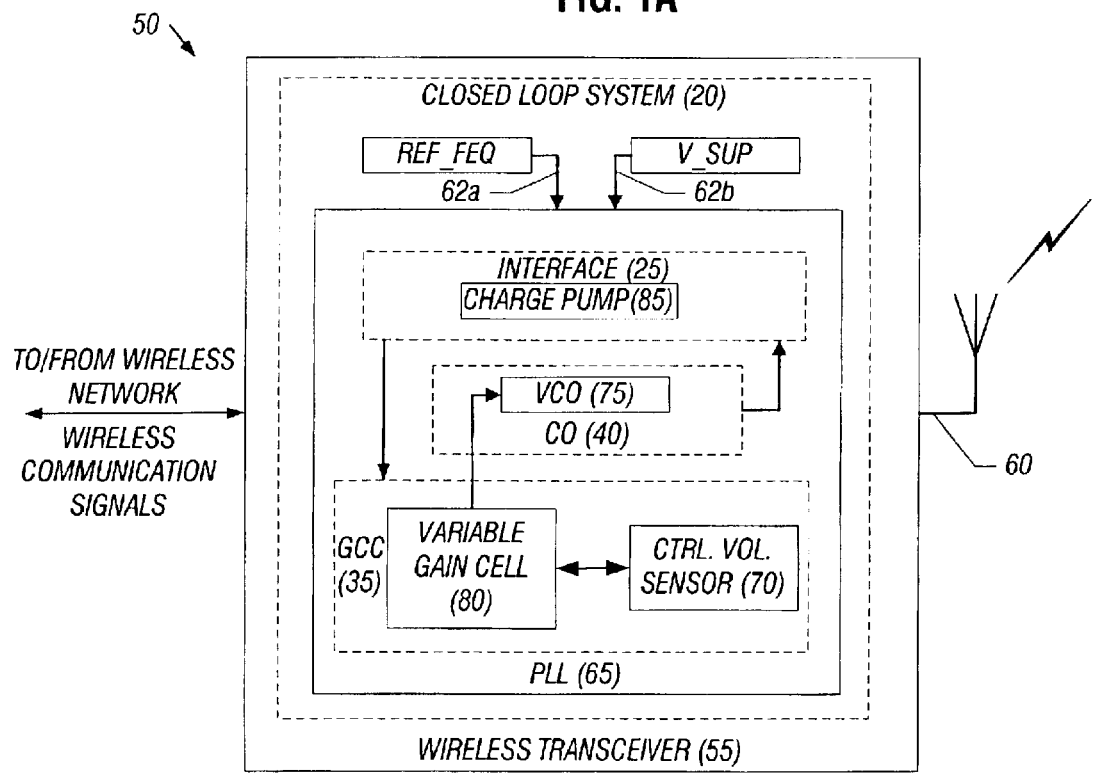
FIG. 1B is a schematic depiction of a wireless interface including a phase-locked loop having a charge pump, a variable gain cell, a voltage control oscillator and a control voltage sensor, according to one embodiment of the present invention.

A wireless interface 50 shown in FIG. 1B includes a wireless transceiver 55 to communicate via a network over a tunable range of frequency, according to one embodiment of the present invention. The wireless interface 50 may send and receive communication signals to and from a wireless network according to any one of many wireless standards being deployed. Consistent with one embodiment, the wireless interface 50 may be usable in multiple frequency bands, such as a 2.4 GigaHertz (GHz) wireless local area network (WLAN), a personal area network (PAN) and a 5.2 GHz WLAN which is extensible to the 24 GHz Industrial, Scientific, and Medical (ISM) band. Examples of the wireless interface 50 include a cell phone, a personal digital assistant (PDA), a tablet, a handset, or any other wireless communication or wireless-enabled computing devices in which extending of a tunable range of frequency may be desirable.

In addition to incorporating the closed loop system 20 shown in FIG. 1A into the wireless interface 50, an antenna 60 may be coupled to the wireless transceiver 55 for receiving and transmitting wireless communications in one embodiment. An example of the antenna 60 is a dipole antenna. An example of the wireless transceiver 55 is a radio frequency (RF) transceiver, such as a global system of mobile communications (GSM) transceiver for communicating over a cellular network. Of course, non-wireless systems, such as a portable computer, may be implemented incorporating the closed loop system 20.

The closed loop system 20 associated with the wireless transceiver 55 may receive the reference frequency (REF_FEQ) on an input 62a and the supply voltage V_SUP on another input 62b, in one embodiment. The closed loop system 20 may further comprise the interface 25, the controllable oscillator stage 40, and the gain compensation circuit 35, forming a phase-locked loop (PLL) 65, as shown in FIG. 1B, consistent with one embodiment of the present invention.

To detect a drop in a gain against an overall loop gain within the closed loop system 20, the gain compensation circuit 35 may comprise a control voltage sensor 70 capable of varying the control voltage V_CTRL being supplied to a variable gain cell 80. According to one embodiment, the controllable oscillator 40 may incorporate a voltage controlled oscillator (VCO) 75. Using the variable gain cell 80, a gain compensation may be provided corresponding to the drop in the gain, in a feed-forward manner, as an example.

In addition to the interface 25, the phase-locked loop 65 may include a charge pump 85, converting a phase error to an output charge for generating the control voltage V_CTRL. In turn, the charge pump 85 may provide an input voltage to the gain compensation circuit 35 for controlling the voltage controlled oscillator 75 based on the control voltage V_CTRL, extending a tunable range of frequency associated with the closed loop system 20, according to one operation consistent with an embodiment of the present invention.

Figure 1C:
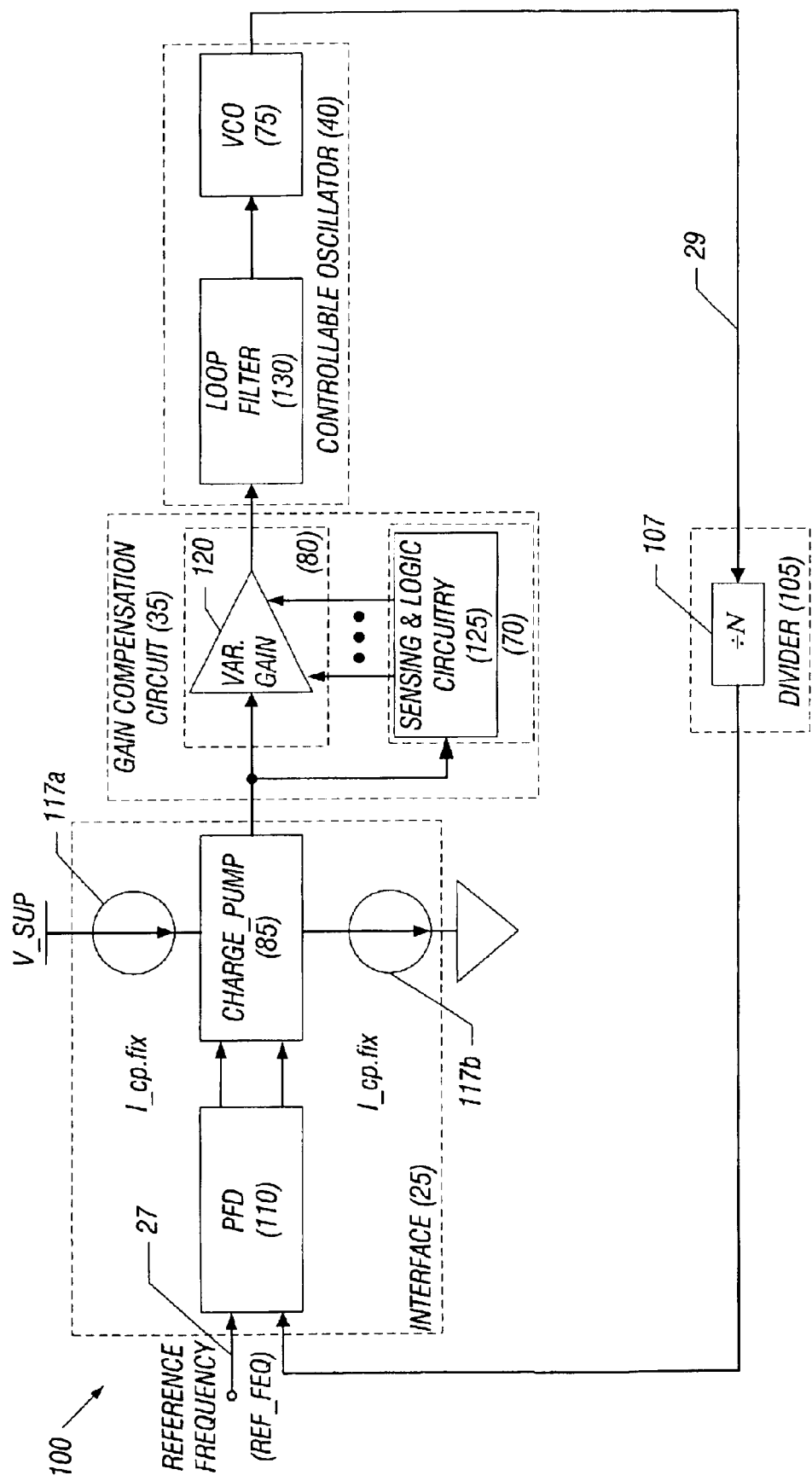
FIG. 1C is a schematic depiction of a semiconductor device or circuit including circuitry to sense a voltage and digitally control a gain compensation within the closed loop system of FIG. 1A, in accordance with one embodiment of the present invention.

Referring to FIG. 1C, for use in a semiconductor device, a circuit 100 includes the PLL 65, forming the closed loop system 20 as shown in FIG. 1B according to one embodiment of the present invention. The circuit 100 may be fabricated in a single supply, low-voltage CMOS process, providing a significantly enhanced tuning range of frequency the PLL 65, in some embodiments. The circuit 100 may include the interface 25 operatively coupled to the gain compensation circuit 35 which is further coupled to the controllable oscillator stage 40. Additionally, a divider 105 may provide feedback, enabling a closed loop operation in a typical PLL manner. The divider 105, in one embodiment, includes a frequency divider 107 that divides the feedback frequency by "N," as an example.

Specifically, the interface 25 may comprise a phase frequency detector (PFD) 110 operably coupled to the charge pump 85. In addition, the gain compensation circuit 35 may include the variable gain cell 80 being controlled via the control voltage sensor 70, providing an adaptive gain compensation, according to one embodiment. That is, based on the control voltage V_CTRL, the gain compensation may be digitally controlled to adaptively compensate for a drop in the gain against an overall loop gain within the closed loop system 20 formed by the closed loop path 29. Essentially, the circuit 100 implements a completely feed-forward digitally controlled gain compensation technique, extending a tunable range of frequency for a host semiconductor device.

The charge pump 85 may be biased by a set of fixed bias current sources 117a, 117b, as shown in FIG. 1C, according to some embodiments of the present invention. While the variable gain cell 80 may further incorporate a variable gain stage 120, the control voltage sensor 70 may include sensing and logic circuitry 125, receiving as an input the output from the charge pump 85 to selectively control the variable gain stage 120.

Besides the gain compensation circuit 35, the circuit 100 may include in the controllable oscillator stage 40 a loop filter 130 (e.g., having a transfer function F(S)) operably coupled to the voltage control oscillator 75, consistent with one embodiment of the present invention. By adjusting the gain of the voltage control oscillator 75 responsive to the gain compensation indicated by the variable gain stage 120, in response to the V_CTRL derived from the sensing and logic circuitry 125, in one embodiment, a tunable range of frequency may be extended up to a full range of the voltage control oscillator 75.

For the purposes of implementing a phase-locked loop operation, in one embodiment, the phase frequency detector 110 may indicate a lock for certain successive cycles of a clock, i.e., the reference frequency REF_REQ, at some point. For example, the lock may be indicated after 16 successive cycles of a reference clock in one case. However, the lock may be subsequently de-asserted if the phase frequency detector 110 determines that, for example, a change in the reference frequency has occurred. Other criteria for obtaining a phase lock may be deployed in the PLL 65 in different embodiments of the present invention. In response to a locked frequency in the PLL 65, according to one embodiment, the charge pump 85 may produce an output voltage based on the input from the phase frequency detector 110.

Figure 2:
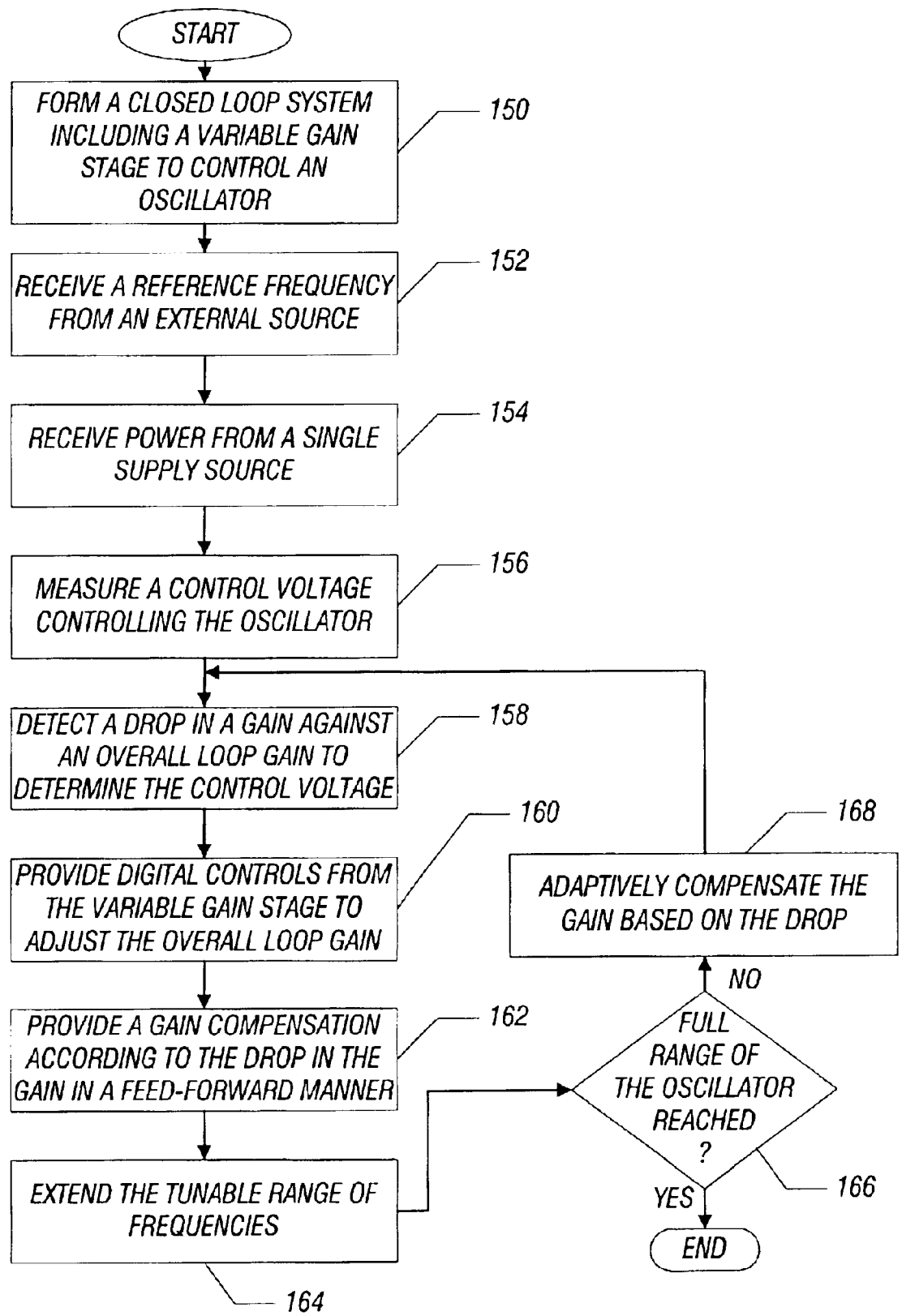
FIG. 2 is a flow chart showing an adaptive extension of tunable frequencies in the closed loop system 20 shown in FIG. 1, according to one embodiment of the present invention.

Referring to FIG. 2, a flow chart shows an adaptive extension of tunable frequencies in the closed loop system 20 shown in FIG. 1A, according to one embodiment of the present invention. At block 150, the closed loop system 20 shown in FIG. 1C may be formed in the circuit 100. However, the circuit 100 may be embedded in a semiconductor device, forming the wireless transceiver 55 illustrated in the embodiment depicted in FIG. 1B. In this example, the closed loop system 20 enables a phase-locked loop operation for the PLL 65. A reference frequency REF_FEQ, such as a clock signal may be received from an external source at block 152. Additionally, the single power supply source 45 (FIG. 1A) may provide the voltage supply V_SUP to power the wireless transceiver 55 at block 154.

At block 156, the control voltage sensor 70 may measure or monitor the control voltage V_CTRL that essentially controls the voltage control oscillator 75 in one embodiment. A drop in a gain against an overall loop gain may be detected to cause a change in the control voltage V_CTRL at block 158. In response to the proportionate change in the control voltage V_CTRL, the variable gain stage 120 of the variable gain cell 80 located in the gain compensation circuit 35 may digitally control the gain of the voltage controlled oscillator 75, adjusting the overall loop gain at block 160 in some embodiments. Accordingly, a gain compensation based on the drop in the gain may be provided, at block 162, i.e., in a feed-forward manner in one embodiment of the present invention. In this manner, the tunable range of frequency may be desirably extended responsive to on the gain compensation being provided at block 164.

A check at diamond 166 may determine whether or not the tunable range of frequency has reached the full range of the voltage-controlled oscillator 75. When the full range of the voltage-controlled oscillator 75 is reached at the diamond 166, the flow ends in one embodiment, as shown in FIG. 2. Conversely, if the full range is not reached, then the gain may continue to be adaptively compensated based on the drop at block 168. Because the drop in the gain against an overall loop gain may be iteratively determined at block 158, the process may repeat itself until the tuning range of frequency extends all the way up to the full range of the voltage control oscillator 75, in accordance with one embodiment of the present invention.

To this end, for the control voltage sensor 70 shown in FIG. 1C, one or more tuning characteristics of the voltage control oscillator 75 may be measured in one embodiment. By correcting the drop in the gain at two ends of an available range of the control voltage V_CTRL, the variable gain stage 120 may continuously adjust the overall loop gain for the circuit 100, in one embodiment. In particular, at least one of the tuning characteristics of the voltage control oscillator 75 may be monitored and adjusted to provide a piece-wise linear compensation.

Figure 3:
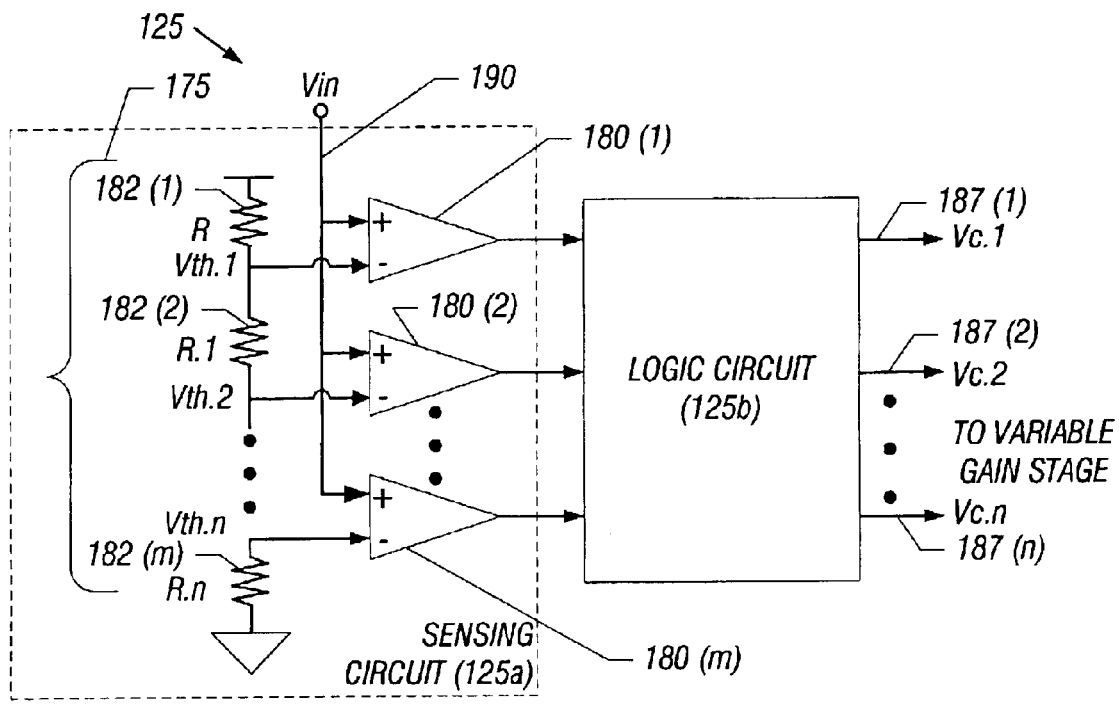
FIG. 3 shows a sensing and a logic circuit implementing the sensing logic circuitry as shown in FIG. 1C being capable of detecting a drop in a gain of a controllable oscillator for the semiconductor device or circuit shown in FIG. 1, in accordance with one embodiment of the present invention.

The sensing and logic circuitry 125 shown in FIG. 3 may include a sensing circuit 125a which is operably coupled to a logic circuit 125b, according to one embodiment of the present invention. The sensing circuit 125a may further comprise a resistive ladder 175 and comparators 180(1) to 180(m) in order to sense the control voltage V_CTRL, in one embodiment. Additionally, the resistive ladder 175 may include one or more resistors 182(1) through 182(m). However, by ensuring that the ratio between the resistance variations across the resistors 182(1) through 182(m) in one embodiment, absolute values of the resistors 182(1) through 182(m) may not be desired to implement the resistive ladder 175.

By selecting a suitable number of resistors 182 for the resistive ladder 175 depending upon a particular application, the granularity of the gain compensation may be altered in one situation without departing from the spirit and scope of the present invention. For example, by using a predetermined number of resistors 182, a desired degree of granularity in the gain compensation may be obtained, in some cases. To provide a respective output to the logic circuit 125b, a resistor 182 may be operatively coupled to a corresponding comparator 180 in one embodiment.

Any one of a variety of other architectures may be deployed to sense an input voltage Vin at an input terminal 190 in one embodiment. In response to an output from the sensing circuit 125a, a corresponding control voltage (Vc.x, x from 1 to n) 187 may be provided to the variable gain stage 120, as shown in FIG. 1C. Although not so limited, in an embodiment, a set of control voltages may be obtained from the logic circuit 125b on output terminals 187(1) through 187(m).

A control voltage may indicate a certain voltage level different than others, depending upon an input voltage Vin from the charge pump 85 sensed at the input terminal 190. This input voltage Vin may correspond to a drop in the gain for the voltage control oscillator 75, in some embodiments of the present invention. In response to the input voltage Vin present at the input terminal 190, a particular control voltage of the set of control voltages on the output terminals 187(1) through 187(m) may be later selected. In this way, by example, the variable gain stage 120 may be implemented in any one of many ways, essentially providing an ability to vary gain in response to an excitation that is different from the normal uncompensated excitation.

Figure 4A:
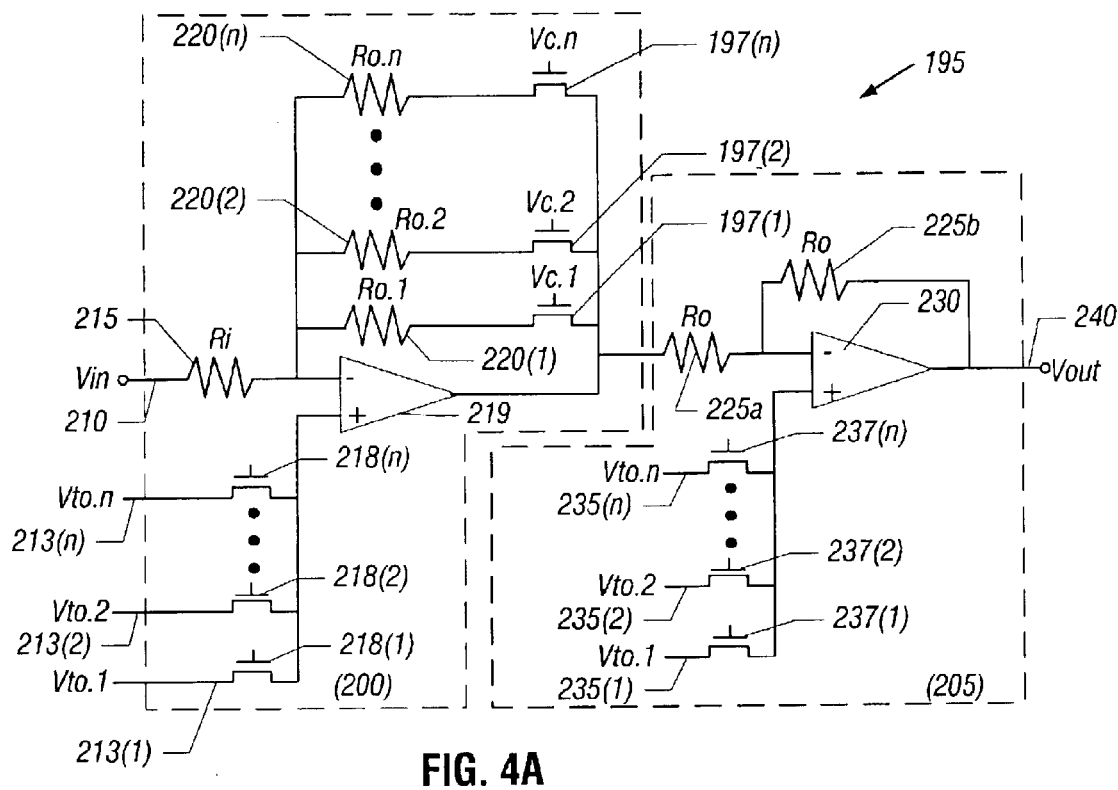
FIG. 4A shows one embodiment a voltage-mode variable gain stage that is digitally controllable in a feed-forward manner to adjust the gain based on the drop for the semiconductor device or circuitry, shown in FIG. 1C.

For instance, a voltage-mode variable gain stage 195 in which the primary signal being manipulated is voltage and the role of currents is merely incidental, as shown in FIG. 4A, may implement the variable gain stage 120 shown in FIG. 1C, according to one embodiment of the present invention. The voltage-mode variable gain stage 195 may comprise an input stage 200 and an output stage 205, in one embodiment.

The input stage 200 may include an operational amplifier (OPAMP) 219 in an inverting configuration, providing a variable gain in response to any one of control voltage switches 197(1) through 197(n) being activated responsive to a respective control voltage Vc.1 to Vc.n. An input terminal 210 may receive an input voltage on an input resistor (Ri) 215. A particular bias voltage among bias voltages Vto.1 to Vto.n may be applied on a respective terminal of terminals 213(1) through 213(n) when a specific switch is activated from switches 218(1) through 218(n). Each one of the selected bias voltages (Vto.1 through Vto.n) may appropriately bias the OPAMP 219.

The OPAMP 219 may further include a plurality of feedback resistors Ro.1 through Ro.n of which one may be disposed on an associated feedback path of feedback paths 220(1) through 220(n). Each feedback path may include a respective switch of switches 197(1) and 197(n). One of the switches 197(1) through 197(n) may receive control voltage signal Vc.x to select a particular feedback path 220. Specifically, the control voltage Vc.1 may be applied to the switch 197(1), causing a current to flow through resistor Ro.1 in the feedback path 220(1), providing an output voltage from the input stage 200.

The output stage 205 may receive an input from the input stage 200 for another OPAMP 230 configured in a non-inverting configuration. To this end, the output voltage from the input stage 200 may be applied to an output resistor (Ro) 225a coupled to a feedback resistor (Ro) 225b, enabling a feedback path in the output stage 205, which may provide an output voltage (Vout) on an output terminal 240, in one embodiment. In order to bias the OPAMP 230, a plurality of bias voltages Vto.1 to Vto.n on terminals 235(1) through 235(n) may be provided to the non-inverting input of the OPAMP 230 in some embodiments. Each of the bias voltages Vto.1 through Vto.n may be selected via a respective switch of switches 237(1) through 237(n) consistent with one embodiment of the present invention.

According to one operation consistent with an embodiment, by selecting a particular control voltage Vc.1 to Vc.n using a specific switch of the switches 197(1) through 197(n), and a corresponding bias voltage Vto.1 through Vto.n by activating an associated switch from the switches 218(1) to 218(m) and switches 237(1) to 237(n), a desired output voltage Vout maybe generated at the output terminal 240. Because the gains of the OPAMPs 219 and 230 may be varied by the selection of feedback resistors Ro.1 through Ro.n and bias voltages Vto.1 to Vto.n, in response to control voltages Vc.1 to Vc.n, the output voltage Vout which controls the voltage controlled oscillator 75 may selectively adjust the gain thereof in one embodiment. Accordingly, a piecewise linear approximation for gain compensation in the voltage-mode variable gain stage 195 may be obtained, in some embodiments of the present invention.

Figure 4B:
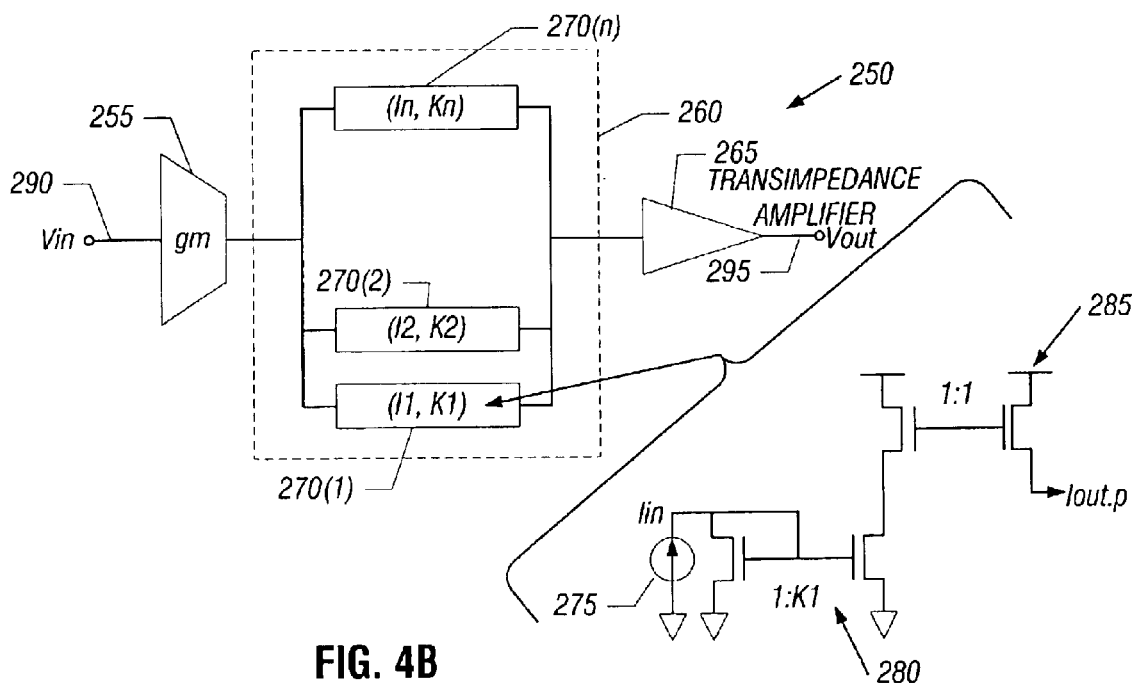
FIG. 4B shows in an alternate embodiment a current-mode variable gain stage suitable to adaptively compensate for a drop in the gain for the semiconductor device or circuit shown in FIG. 1C.

A current-mode variable gain stage 250 in which the primary signal being manipulated is current (the roll of the voltages is simply incidental), as shown in FIG. 4B, may implement the variable gain stage 120 (shown in FIG. 1C) in accordance with another embodiment of the present invention. The current-mode variable gain stage 250 may comprise an input transconductance (gm) stage 255 coupled to a plurality of buffer cells 260 which are further coupled to a transimpedence amplifier 265. The current-mode variable gains stage 250 may provide a variable gain adjustment in the output voltage Vout on an output terminal 295, in response to an input voltage Vin applied on an input terminal 290, according to one embodiment of the present invention.

The buffer cells 260 may further comprise a plurality of current-mode variable gain circuits 270(1) through 270(n). Each current-mode variable gain circuit 270 may be adapted to provide a different current input-output ratio, producing a current output based on the different current input-output ratio. For example, the current-mode variable gain circuit 270 may comprise an input current source 275, biasing a pair of current mirrors.

Specifically, a P-type metal oxide semiconductor (PMOS) current mirror 280 having a current ratio "1:K1" may mirror the output current to a N-type metal oxide semiconductor (NMOS) current mirror 285 having a current mirroring ratio "1:1." Particularly, the current-mode variable gain circuit 270(1), using the PMOS current mirror 280 and the NMOS current mirror 285 may provide output currents Iout.p and Iout.n (not shown) in one embodiment. Based on a particular current-mode variable gain circuit 270 that provides a different output current with respect to other circuits 270, the gain may be accordingly adjusted in the current-mode variable gain stage 250, depending upon the input voltage Vin at the input terminal 290. In this manner, any one of the current-mode variable gain circuits 270(1) through 270(n) may be appropriately biased, causing an output current based on the current mirroring ratios in that current-mode variable gain circuit 270.

Figure 5:
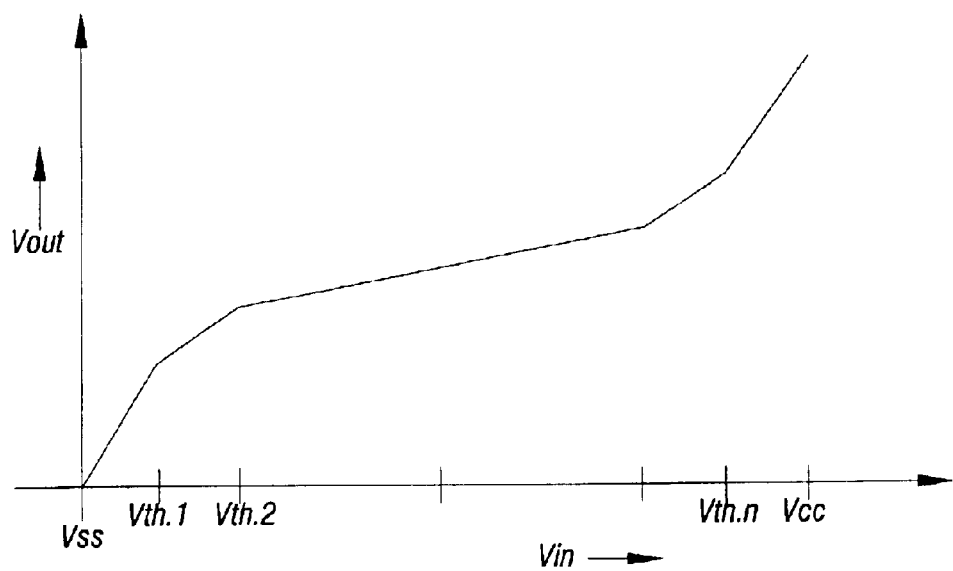
FIG. 5 is a chart showing the transfer characteristic of the variable gain cell shown in FIG. 1B, according to one embodiment of the present invention.

By way of an example, the transfer characteristics of the variable gain cell 80 are shown in FIG. 5, according to one embodiment of the present invention. In response to the input voltage Vin, the output voltage Vout increases based on a particular bias voltage Vth.1 though Vth.n being used or selected in one embodiment. Using the variable gain cell 80, having the transfer characteristics shown in FIG. 5, a gain compensation may be digitally controlled within the closed loop system 20 of FIG. 1A. That is, the variable gain cell 80 may be located within the gain compensation circuit 35, enabling a digitally controllable feed-forward adjustment of a gain, based on the drop in the gain for the closed loop system 20.

Figure 6A:
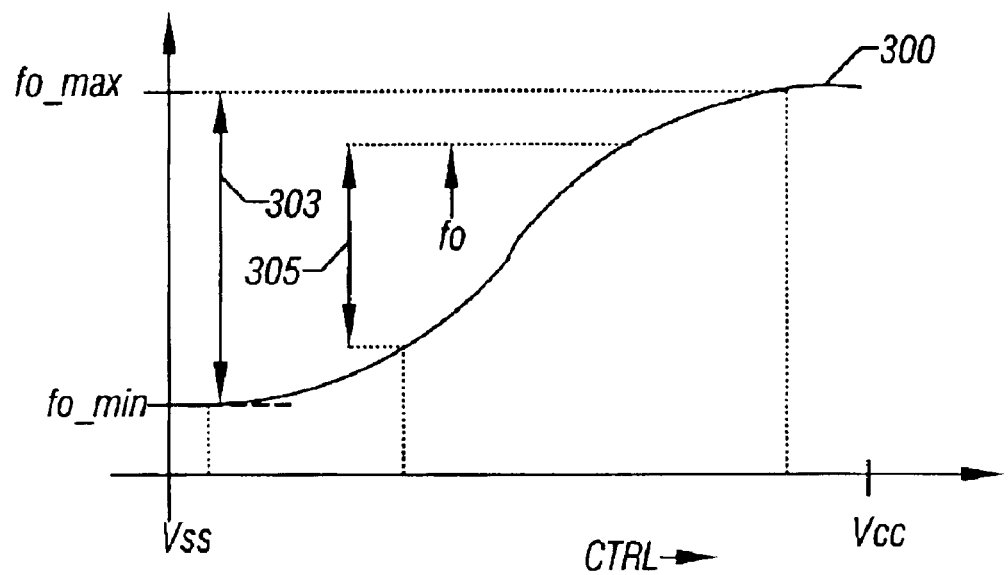
FIG. 6A shows a chart of the frequency vs. voltage curve for the wireless interface shown in FIG. 1B, in accordance with one embodiment of the present invention.

A chart showing a frequency vs. voltage (f-V) curve 300 is shown in FIG. 6A for the wireless interface 50 shown in FIG. 1B, in accordance with one embodiment of the present invention. Use of the control voltage V_CTRL within the supply voltage (V_SUP) range from Vss to Vcc may allow operation of the wireless interface 50 over a wider range of frequencies in one embodiment. The tunable range of frequencies may be extended from a linear region of an uncompensated frequency range 305 of the f-V curve to a compensated frequency range 303 within a minimum-maximum range of frequencies, i.e., from a minimum frequency (fo_min) to a maximum frequency (fo_max).

Figure 6B:
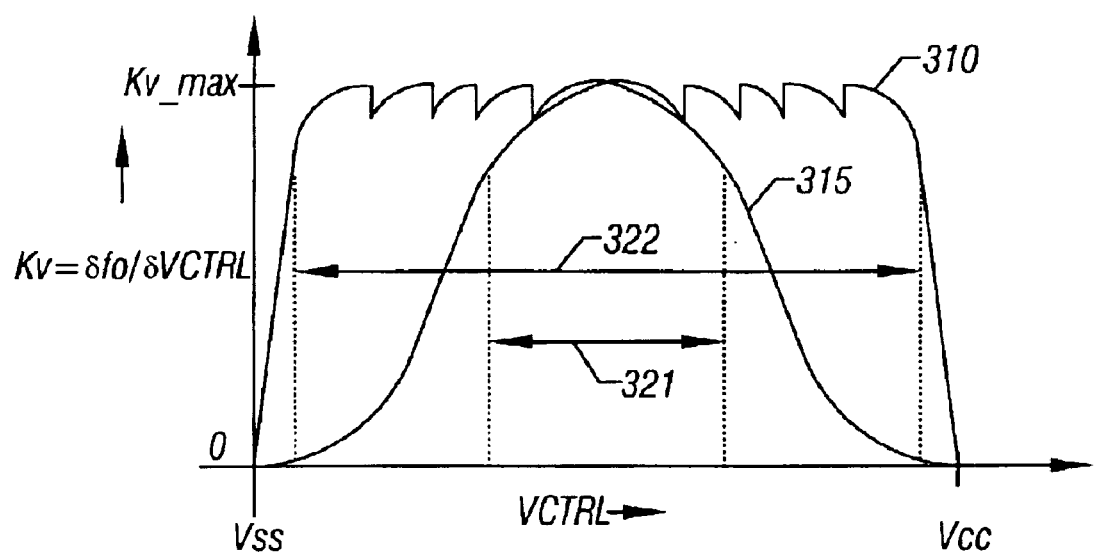
FIG. 6B is a chart showing an effective gain of the combination of the charge pump and the voltage control oscillator shown in FIG. 1B, according to one embodiment of the present invention.

Referring to FIG. 6B, a chart shows an effective gain of the combination of the charge pump 85 and the voltage control oscillator 75 both shown in FIG. 1B, according to one embodiment of the present invention. Because the uncompensated frequency range 305 may be extended to the compensated frequency range 303 by a gain adjustment, in some embodiments, a corresponding range of gain may also be extended, as shown in FIG. 6B. An uncompensated gain curve 315 may be modified to a compensated gain curve 310, using the charge pump 85 and the voltage control oscillator 75. As a result, an uncompensated tuning range of voltage 321 for the gain may be compensated to provide a compensated tuning range of voltage 322 for the control voltage V_CTRL in one embodiment.

Figure 7:
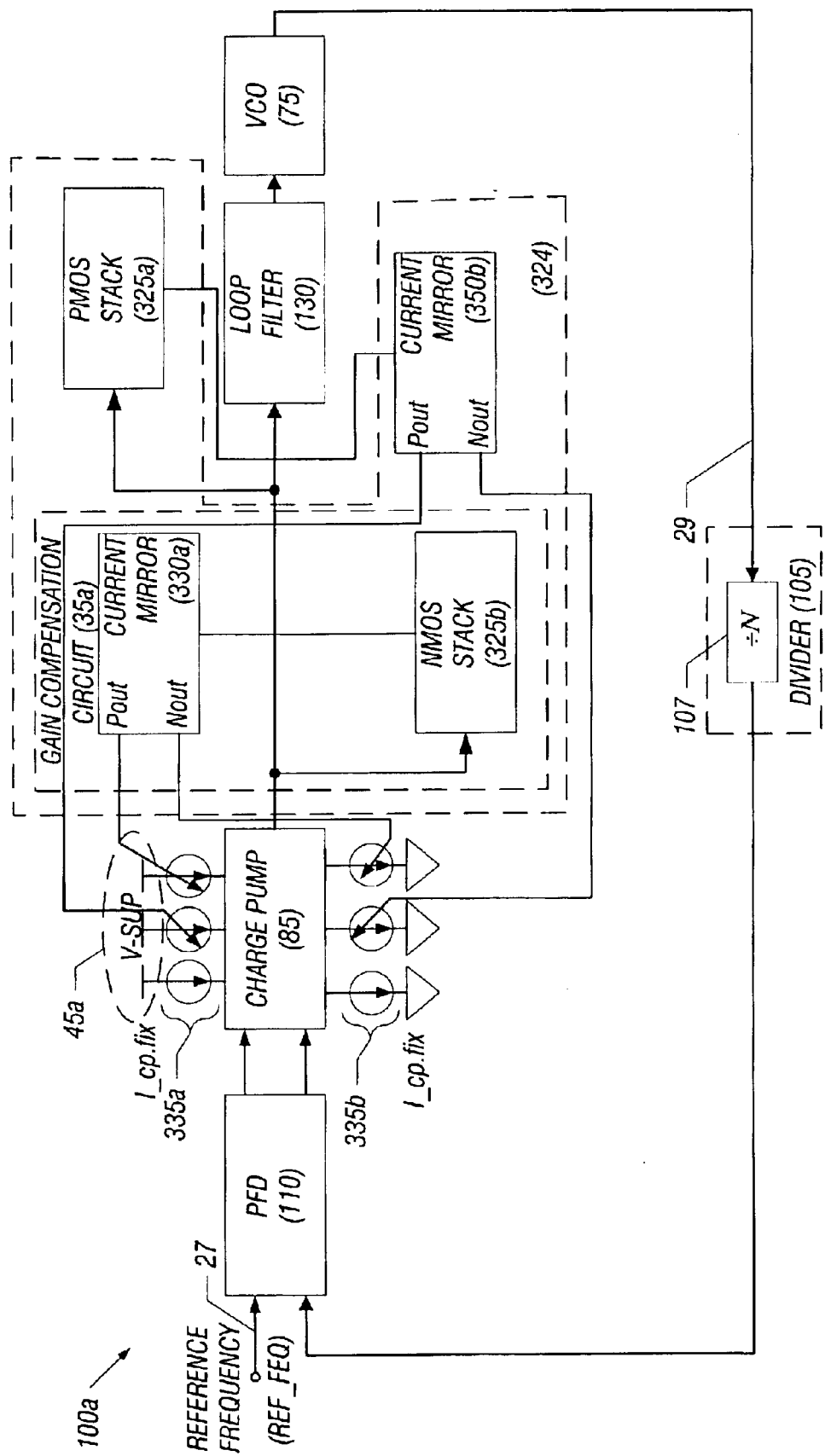
FIG. 7 is a schematic depiction of a closed loop system with a single supply source controlling a complementary structure of two transistor types in the circuitry of FIG. 1C, according to an alternate embodiment of the present invention.

A closed loop system 100a shown in FIG. 7 for use with a single supply source 45a may include a complementary structure of two transistor types 324 within a gain compensation circuit 35a to extend a tunable range of frequencies, according to one embodiment of the present invention. The closed loop gain of the closed loop system 100a may be adaptively adjusted through the other components than the gain compensation circuit 35a in this embodiment.

The complementary structure of two transistor types 324 may comprise a P-type metal oxide semiconductor (PMOS) stack 325a and an N-type metal oxide semiconductor (NMOS) stack 325b. For the purposes of mirroring currents, current mirrors 330a and 330b may be operably coupled to the PMOS and NMOS stacks 325a and 325b, respectively, in one embodiment. Currents from the current mirrors 330a and 330b may be mirrored into the charge pump 85 which is being controlled through a bias current source including two complementary components 335a and 335b.

In operation, a gain drop-off at the two ends of the control voltage V_CTRL range extending from a voltage range Vss to Vcc of the supply voltage source 45a may be corrected for by measuring the control voltage V_CTRL. Specifically, the gain of the charge pump 85 may be controlled through the complementary components 335a and 335b of the bias current source. In the complementary structure of transistor types 324, the current in the PMOS stack 325a may increase at low control voltage levels for the control voltage V_CTRL, while the NMOS stack 325b may sink higher currents at relatively high control voltage levels of the control voltage V_CTRL.

Accordingly, by suitably scaling the currents in the PMOS and NMOS stacks 325a and 325b, and mirroring these currents into the charge pump 85 via the bias current source components 335a and. 335b, the gain drop-off or reduction at the maximum and minimum ends of the control voltage V_CTRL range may be compensated. In this way, the tunable range of frequencies may be extended in the closed loop system 100a to approximately the full range of the voltage control oscillator 75 while still maintaining settling time and phase noise performance in a single supply voltage scenario. For example, a single supply low-voltage design may be implemented for the closed loop system 100a in a digital CMOS process, in some embodiments of the present invention.

The complementary structure of transistor types 324 in conjunction with the charge pump 85 being operated via the bias current source components 335a and 335b may provide a robust gain compensation for the closed loop system 100a. As few examples, a phase-locked loop or a frequency synthesizer may operate at a tunable range of frequencies extended all the way to the full range of the voltage control oscillator 75 allowing operation of the closed loop system 100a over a wider range of frequencies.

Figure 8:
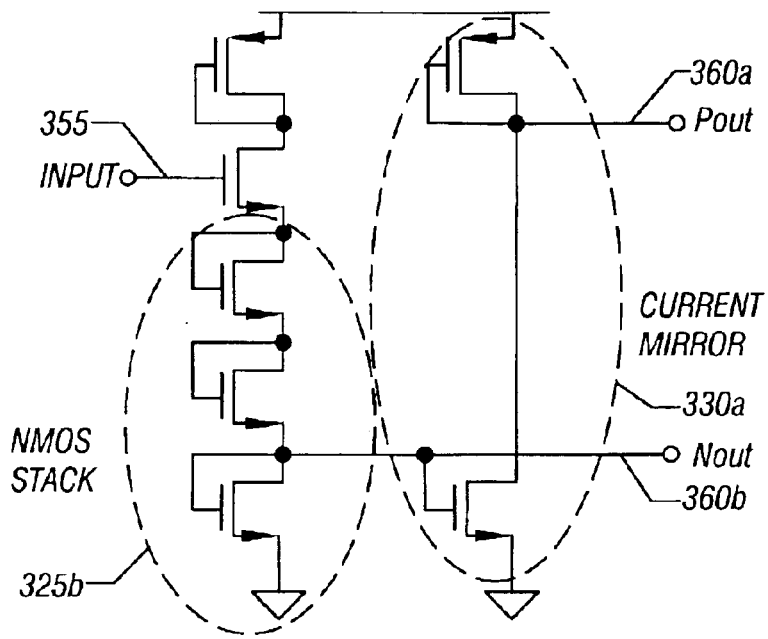
FIG. 8 is a schematic depiction of a NMOS stack and a mirror deployed in the complementary structure shown in FIG. 7 consistent with one embodiment of the present invention.

Consistent with one embodiment of the present invention, the NMOS stack 325b and the current mirror 325 are shown in FIG. 8 which are deployed for the complementary structure 324 shown in FIG. 7. In response to an input on an input terminal 355, the combination of the NMOS stack 325b and the current mirror 330a may provide a first output current (Pout) on terminal 360a and an a second output current (Nout) on another terminal 360b, using any one of many conventional mirroring circuit techniques.

Figure 9:
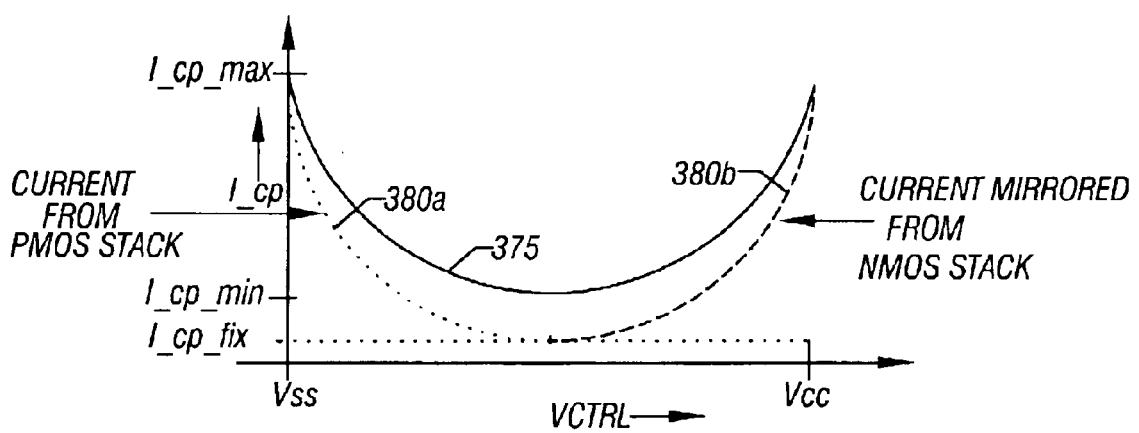
FIG. 9 is a chart showing currents from the charge pump shown in FIG. 1B, in accordance with one embodiment of the present invention.

A chart showing currents from the charge pump 85 (FIG. 1B) are depicted in FIG. 9, in accordance with one embodiment of the present invention. In response to a current 375 sourced from the charge pump 85, a mirrored current 380a from the PMOS stack 325a and another mirrored current 380b from the NMOS stack 325b may be obtained across the control voltage V_CTRL range. As can be seen, the PMOS stack 325a at low current control voltage V_CTRL levels provides the current 380a which increases toward the Vss end of supply voltage (V_SUP) range.

Figure 10A:
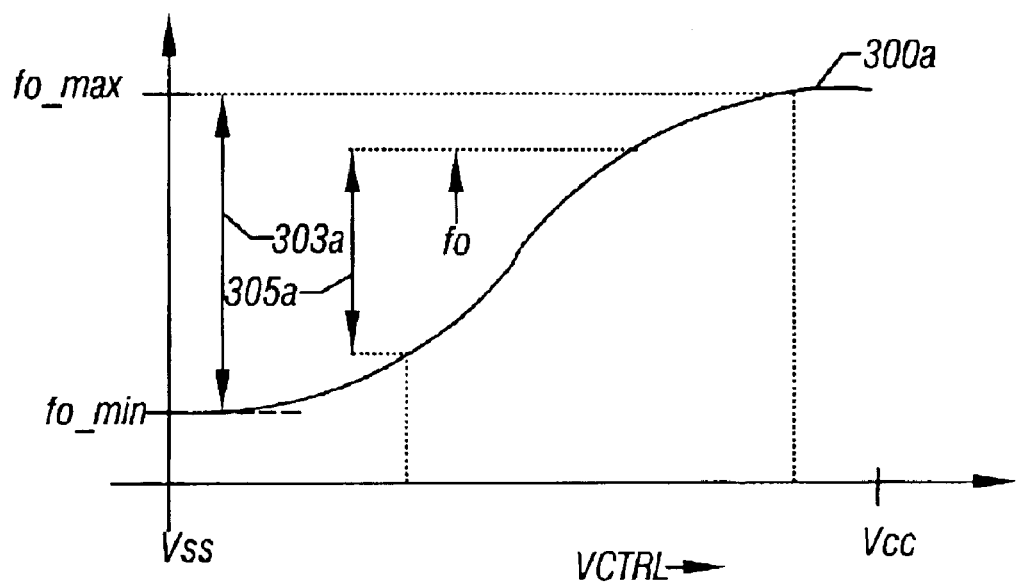
FIG. 10A is a chart showing a frequency vs. voltage curve for the closed loop system shown in FIG. 7, according to one embodiment of the present invention.

A chart showing a frequency vs. voltage (f-V) curve 300a is shown in FIG. 10A for the circuit 100a shown in FIG. 7, in accordance with one embodiment of the present invention. Use of the control voltage V_CTRL within the supply voltage (V_SUP) range from Vss to Vcc, as described above, may allow operation over a wider range of frequencies in one embodiment. The tunable range of frequencies may be extended from an uncompensated range of frequencies 305a of the f-V curve to another compensated range of frequencies 303a.

Figure 10B:
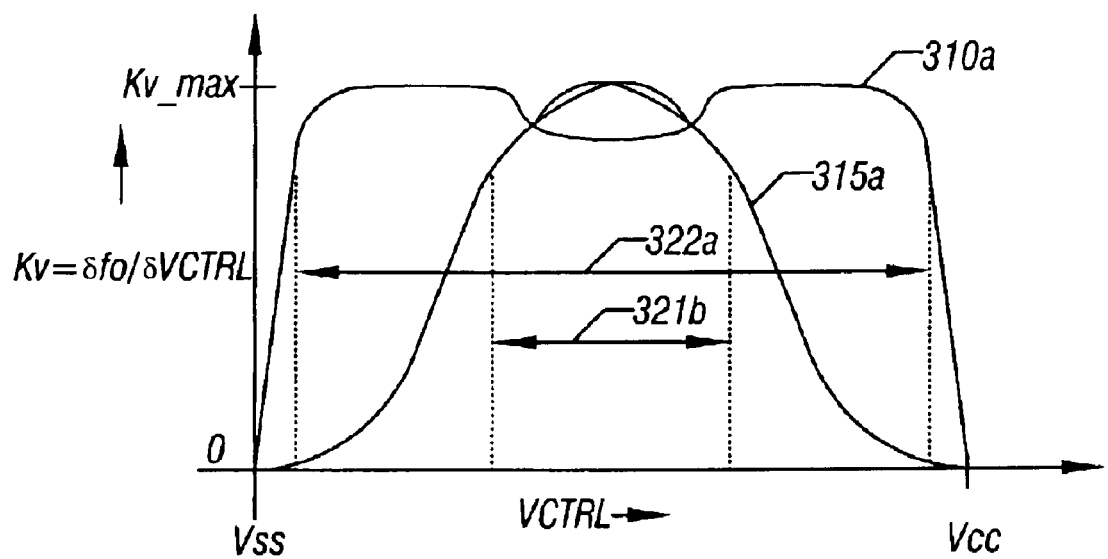
FIG. 10B is a chart showing an effective gain compensation causing tuning range enhancement in the closed loop system shown in FIG. 7, in accordance with one embodiment of the present invention.

Referring to FIG. 10B, a chart shows an effective gain compensation causing tuning range enhancement in the circuit 100a shown in FIG. 7, according to one embodiment of the present invention. The uncompensated frequency range 305a may be extended to the compensated frequency range 303a via an appropriate gain adjustment. Likewise, an uncompensated gain curve 315a may be adjusted to provide a compensated gain curve 310a. In this way, an uncompensated gain tuning range 321a may be compensated to provide a compensated gain tuning range 322a responsive to the control voltage V_CTRL in one embodiment.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A communication system comprising:

a wireless interface to communicate over a wireless local area network;

a controllable oscillator coupled to an interface; and a device operably coupled to said controllable oscillator to extend a tunable range of frequency within a closed loop by compensating for a drop in a gain of said controllable oscillator in the closed loop.

2. The communication system of claim 1, wherein said wireless interface further comprising:

an interface to receive a reference frequency from a source external to said wireless interface; and a supply source to power said wireless interface.

3. The communication system of claim 2, wherein said wireless interface further comprising:

a compensation circuit operably coupled between said interface and said controllable oscillator to form the closed loop, sense a voltage that controls said controllable oscillator and digitally control a gain compensation, said compensation circuit including:

a sensing logic that detects a voltage that controls said controllable oscillator and provides digital controls for a gain compensation; and a variable gain stage coupled to said sensing logic to adaptively compensate for the drop in the gain based on the gain compensation.

4. The communication system of claim 1, further comprising:

a radio frequency transceiver operably coupled to said device to receive and transmit a wireless communication via the wireless local area network within said tunable range of frequency.

* * * * *